(12) United States Patent
Kuenemund et al.

(10) Patent No.: US 7,898,836 B2
(45) Date of Patent: Mar. 1, 2011

(54) MASKED MEMORY CELLS

(75) Inventors: Thomas Kuenemund, Munich (DE); Karl Zapf, Munich (DE); Artur Wroblewski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 302 days.

(21) Appl. No.: 12/106,927

(22) Filed: Apr. 21, 2008

(65) Prior Publication Data

US 2009/0323389 A1    Dec. 31, 2009

(51) Int. Cl.
   *G11C 17/00*    (2006.01)
(52) U.S. Cl. ............. 365/104; 365/189.11; 365/189.17
(58) Field of Classification Search ............. 365/104, 365/189.1, 189.17, 189.11
   See application file for complete search history.

(56) References Cited

U.S. PATENT DOCUMENTS

| | | | |
|---|---|---|---|
| 6,154,384 A | 11/2000 | Nataraj et al. | |
| 6,496,399 B1 * | 12/2002 | Choi et al. | 365/49.17 |
| 6,646,900 B2 | 11/2003 | Tsuda et al. | |
| 6,760,241 B1 | 7/2004 | Gharia | |
| 6,845,025 B1 * | 1/2005 | Nataraj | 365/49.1 |
| 7,154,764 B2 * | 12/2006 | Nataraj | 365/49.15 |
| 2008/0205169 A1 * | 8/2008 | Kuenemund et al. | 365/190 |

* cited by examiner

*Primary Examiner*—Pho M Luu
(74) *Attorney, Agent, or Firm*—Dickstein Shapiro LLP

(57) ABSTRACT

An array of masked memory cells including a first memory cell in a first column and a second memory cell in a second different column, wherein the first memory cell is capable of being accessed, so as to output, dependent on a first binary mask signal, a first binary value at a first output and a second binary value at a second output or vice versa, wherein the second memory cell is capable of being accessed, so as to output, dependent on a second binary mask signal, a first binary value at a third output and a second binary value at a fourth output or vice versa, and wherein the second and the third outputs of the memory cells are connected to an identical bit line of the memory array.

17 Claims, 13 Drawing Sheets

MASKED MEMORY CELLS

BACKGROUND

Several embodiments described herein relate to masked memory cells and, in particular, to masked memory cells using the available resources more efficiently while preserving the functionality of the masked (maskable) memory cell.

In the field of security applications, for memory circuitry in particular, various methods of attack are known from which memory circuitry is to be protected. The differential power analysis (DPA) is a common technique for attacking ICs (IC=integrated circuit) and/or memory circuitry. These attacks also serve for assessing the sensitivity of packages to security applications with respect to deliberate attacks on "confidential" information such as passwords or cryptographic keys. For a given program or a given algorithm, in these attacks, power profiles measured by statistical methods and/or their charge integrals calculated over one or more clock cycles are evaluated wherein, for a multitude of program executions, conclusions to the information to be protected may be drawn from the correlation of systematic data variation and a respective charge integral.

One way to at least substantially impede DPA attacks consists in exchanging or transferring data among subsystems of an IC encrypted, as far as this is possible. One possible cryptosystem for this purpose, as it is proven safe, is the so-called one-time-pad encryption. In this method, plain texts $m=(m_1, m_2, \ldots )$ encoded as a bit sequence are encrypted with keys $k=(k_1,k_2,\ldots)$ obtained from truly random sequences, according to $c=e(k,m)=(k_1 \oplus m_1, k_2 \oplus m_2, \ldots )$, that is, a bit $c_j$ of the ciphertext $c=e(m,k)$ results from the XOR operation $k_j \oplus m_j$ of the corresponding bits of key k and plaintext m. Due to $k \oplus k=0$ and $0 \oplus k=k$, $k_j \oplus c_j = m_j$ holds true, that is, the decryption of c so as to restore the plaintext m, takes place according to the same bitwise XOR operation.

In the one-time-pad cryptosystem, it is important that each key sequence be used only once each for the encryption and the decryption, as otherwise information on plaintexts may be determined by means of statistical methods.

FIG. 1 shows an example of an array of maskable memory cells developed to overcome the problem of having to transport data stored in a memory cell without encryption, i.e. applying one-time-pad encryption simultaneously with readout of the stored data, as it is explained in more detail below.

For the following considerations, one exemplary memory cell 160 of the memory cell array of FIG. 1 will be discussed.

FIG. 1 shows an mROM cell 160. The mROM cell 160 is programmed to logic 0, wherein a programming to logic 1 is denoted by connections drawn in dashed lines. The mROM cell 160 shows a word line 150 at which a binary query signal may be applied. Furthermore, the mROM cell 160 exhibits a first output 110 for a first binary value bl and a second output 120 for a second binary value blq, which is complementary to the first binary value bl. Furthermore, the mROM cell 160 exhibits a first input 130 for a first mask value m and a second input 140 for a second masking value mq, which is complementary to the first masking value m (together being a valid mask signal comprising two logically complementary subsignals m and mq).

In the following Figures, the logic elements are predominantly realized by n-channel and p-channel FETs. Their control signals are indicated in small letters. For reasons of clarity, the introduction of additional reference numerals for all devices is omitted. Signals implemented in dual-rail logic are indicated by small letters such as m and bl in FIG. 1, and the complementary components are indicated by a subsequent small-letter q such as mq and bq.

FIG. 1 shows an exemplary implementation of an mROM cell 160 having n-channel FETs. This specific implementation only represents an embodiment and is not limiting, other embodiments are conceivable in implementations having p-channel FETs or other transistors and/or electrical switches. FIG. 1 further shows a first transistor 170, which is coupled to and controllable via the word line 150 (wl). The transistor 170 is on the one hand coupled to a reference signal or a reference potential 195 and, via a second FET 180, coupled to the output 110 for the first binary value. Furthermore, the transistor 170 is coupled, via a third FET 190 to the output 120 for the second binary value. The second FET 180 is controllable from the second masking value mq and/or via the input 140. The third FET 190 is controllable via the first masking value m and/or via the input 130.

The connection represented in FIG. 1 therefore corresponds to a stored logic 0, wherein the dashed lines denote the control of the transistors 180 and 190, for the case that a logic 1 were stored. The consideration of the embodiment of the stored logic 0 is not meant limiting.

During readout, the bit-line pair (bl,blq), for an activated word line, wl=1, and with the masking values (m,mq)=(0,1), is brought from its precharge state (1,1) to the state (0,1), whereas for (m,mq)=(1,0), the denotations of bl and blq are interchanged as (bl,blq) then assumes the state (1,0). Sufficiently frequent interchanging of (m,mq) also each time interchanges the denotations of bl and blq. The risk of a DPA attack may thus be reduced and probing is also substantially impeded.

FIG. 2 shows a generalization of the concept of FIG. 1 to re-writeable RAM-cells. The basic functionality of the masking operation is essentially the same as previously discussed in FIG. 1. Considering, as an example, memory cell 200, the data stored within the memory cell is, as usual, preserved using two latched inverters 202a and 202b. As compared to a ROM cell, when implementing dual-rail-logic with RAM cells, both states stored within the latched inverters have to be accessed simultaneously, thus using two read/write transistors 204a and 204b, which are activated by word line 210. As the two possible logical states may be stored within the latched inverters 202a and 202b, it is mandatory to be able to switch each of the outputs to either of the bit lines 220a and 220b. Therefore, four control transistors 230a, 230b, 240a and 240b are required, which are, equivalent to the memory cell of FIG. 1, controlled by the mask-bit-lines 250a and 250b.

In order to operate an array of maskable memory cells, a suitable access logic is required, as shortly summarized below.

The block diagram in FIG. 3 shows an mROM address and/or data flow. FIG. 3 shows an address latch with single-to-dual-rail conversion 810. FIG. 3 further shows a masked address decoder 820 operative to split the addresses in address positions indicating a row of memory cells to be accessed (mAdr_msb) and a column of memory cells to be accessed (mAdr_lsb). A word-line driver 830 is used to address the rows to be accessed. The masked ROM cell 840 may be assembled according to a plurality of masked ROM cells of the embodiment of FIG. 1. FIG. 3 further shows a masked bit-line multiplexer 850 with a peripheral connection and a control block 860 providing enable-signals for the individual components and therefore realizing a self-clocking.

The control block 860 further coordinates the precharge states of the individual components. The address latch 810 is externally provided with address inputs mAdr having a width of a bits, which are masked with a mask resulting from a further input signal mask having a width of m bits. From these two input signals, the address latch 810 may forward the mAdr_msb (msb=most significant bit) highest-order addresses with a width of a_msb bits to the masked address decoder 820 for selection, which, based on a mask mask_msb with a width of m_msb bits performs a demasking thereof.

The mask signal mask_msb results from the input signal mask.

The masked address decoder 820 may now forward the signals mask_Wl with a width of m_mWl bits to the word-line driver 830 for the demasking of the signals mWl with a bit width of a_mWl. The word-line driver 830 is capable of extracting, from these signals, the word-line signals with a width of a_mWl bits, which are present as plaintext. Based on these signals, the masked ROM cell 840 may now read an address area and provide same to the masked bit-line multiplexer 850 with a width of d_mbl bits in a signal mBl. The masked bit-line multiplexer 850 further receives, from the address latch 810, the signals mAdr_lsb (lsb=least significant bit) with a width of a_lsb bits and the signal mask_lsb with a width of m_lsb bits for the masking thereof. Based on these signals, the masked bit-line multiplexer 850 may extract the desired data from the data area provided by the masked ROM cell field 840 and provide same at the output as mDo with a width of d bits. The mask bit-line multiplexer further receives, from the address latch, the signal mask_dbl, which same forwards to the masked ROM cell field 840, and on the basis of which the data areas may be masked, that is, these signals allow the bitwise switching between normal and complementary representation of the data area.

That is mAdr stands for the a-bit-wide masked address inputs, mask represents the m-bit-wide masks for at least mAdr and mDo, the d-bit-wide outputs masked with mask. The signals mAdr_msb, which are a_msb bits wide, comprise the highest-order (dual-rail) addresses for the selection of a_mWl masked word lines mWl, mask_msb and mask_Wl comprise the corresponding m_msb-bit or m_mWl-bit-wide masks, respectively. The signals wl comprise the a_mWl-bit-wide word lines and in general several mROM cell fields, which may be read in parallel and are present as plaintext in the embodiment considered. The signal mbl comprises the d_mbl-bit-wide bit-line pairs masked with the m_mbl-bit-wide masks of generally several mROM cell fields, from which the d-bit-wide data outputs mDo are selected with the mAdr_lsb-bit-wide lowest order and with the m_lsb (the a_lsb-bit-wide lowest-order dual-rail addresses masked with the m_lsb-bit-wide masks mask_lsb).

As becomes apparent from the previously described implementations, masking and dual rail implementations use complex memory cells and operating circuitry, to fulfill the enhanced security requirements.

SUMMARY

Several embodiments subsequently discussed will decrease the complexity of the layout of the memory cells of the circuitry used to operate the masked memory cells, by reducing the number of required components or bit lines, and thus simultaneously decrease the energy consumption as well as chip-area required to implement high-security memories using masked storage cells and transport paths.

BRIEF DESCRIPTION OF THE DRAWINGS

In the following, preferred embodiments are explained in greater detail referring to the accompanying drawings, in which.

DETAILED DESCRIPTION

According to some of the subsequently described embodiments, the access to masked memory cells can be implemented and operated with increased efficiency, since the mask bit lines, which are present, are utilized for addressing memory cells. This may be achieved by only providing logically valid mask signals for a selected group of memory cells affecting only the memory cell which are to be accessed. The remaining memory cells are provided with logically invalid mask signals, i.e. with mask signals, having equal logical states applied to both bit lines used for the provision of the masked signal ([0,0] or [1,1]). This may, as detailed in FIG. 4 below, lead to a strong decrease in required area and devices of the read-out system, since, for example, multiplexers and multiple data paths may be saved.

Figure 3:
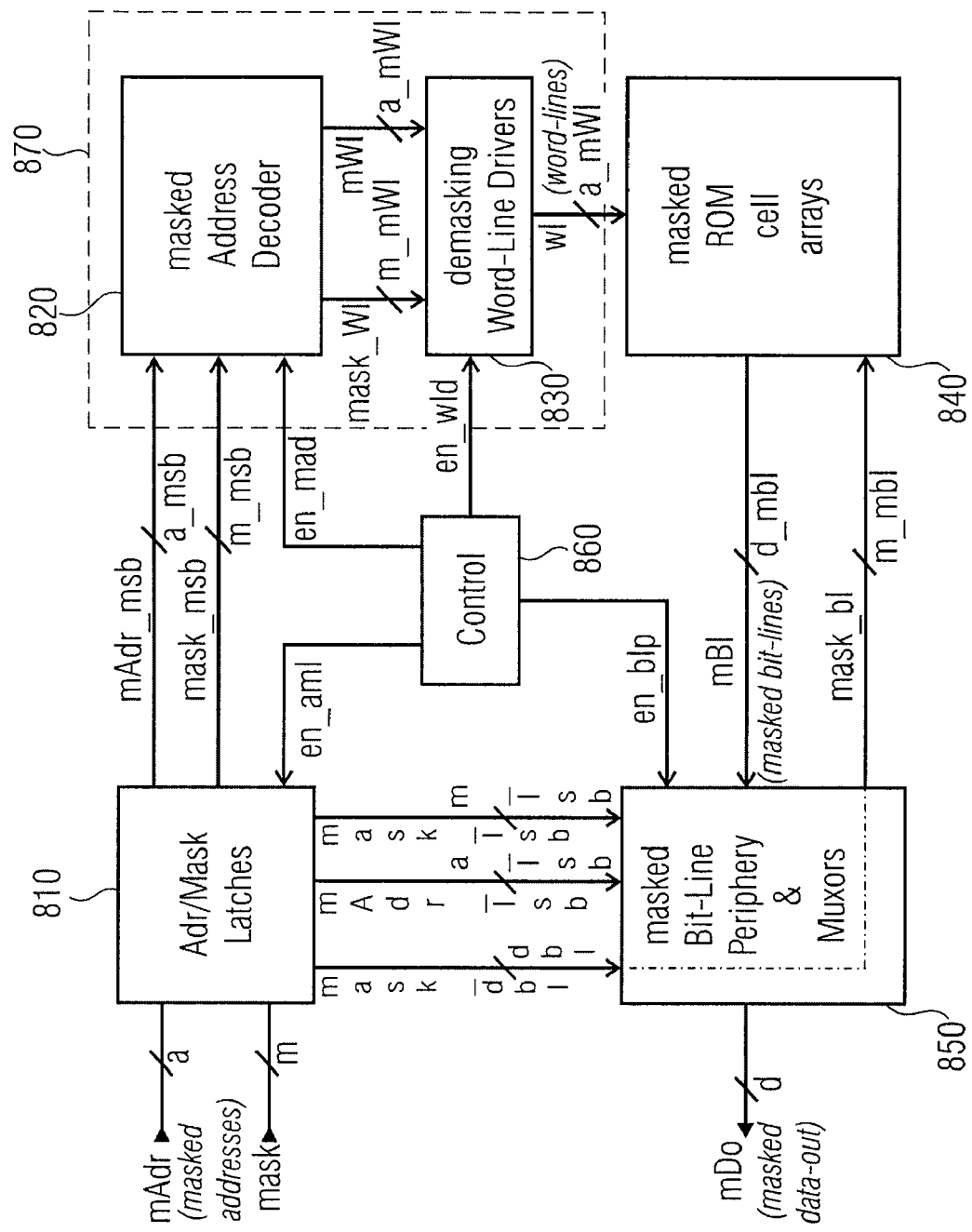
FIG. 3 shows a block-diagram of an access scheme to access masked memory cells.
Figure 4:
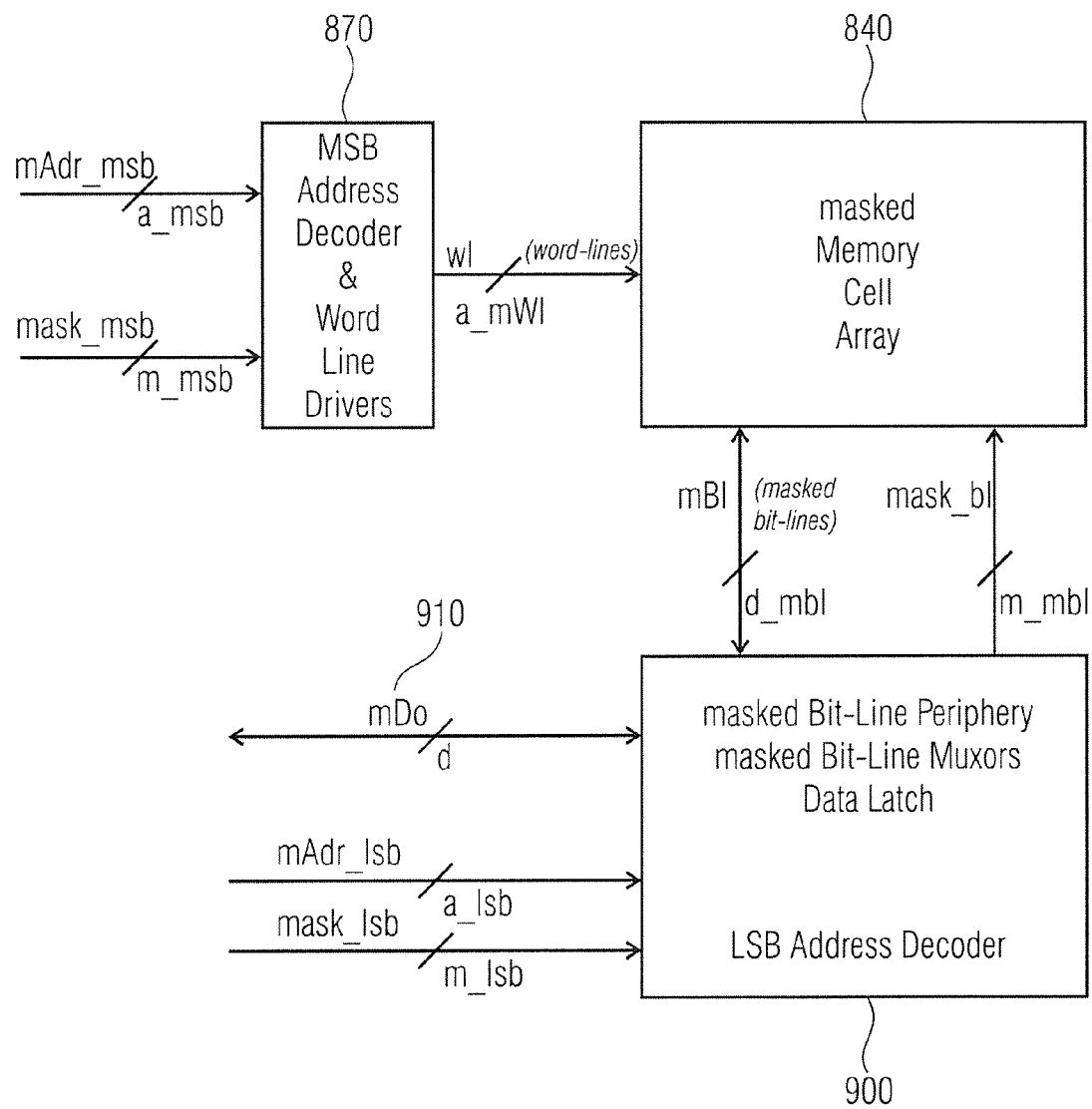
FIG. 4 shows an alternative embodiment for accessing masked memory cells.

FIG. 4 shows a block-diagram of an embodiment implementing the above idea, such that a conventional scheme shown in FIG. 3 may be simplified. As well as in FIG. 3, the embodiment of the read-out scheme utilizes a word-line decoder 870 to decode the masked addresses and to output the word lines, in which the word lines to be activated are derived from the most significant bits of a memory address, as previously described with respect to FIG. 3. That is, all sub-arrays forming the masked memory cell array 840 (for example 4 separately mounted memory sub-arrays, each sub-arrays having identical size) are controlled with the same word line address, that is, the same row of memory elements is selected within all memory sub-arrays of the memory cell array.

However, according to this embodiment, the column to be accessed is also selected within the access cycle, utilizing the mask bit lines, such that the masked memory cell array does no longer deliver the content of all columns associated to the selected row, but only of the particular columns indicated by the least significant bits of the memory address. That is, some bit lines carrying data of all columns to mask bit line decoding block 850 of FIG. 3 may be saved. Also the multiplexer implemented within the masked bit line accessing block 850 itself may be saved, which formerly was intended to extract the actually required bits from the selected row of bits provided by individual memory sub-arrays.

To this end, an embodiment of the masked bit line readout circuitry 900 allowing to select only those memory cells which are to be accessed (i.e. those memory cells indicated by the relevant least significant bits of the memory address) requires an LSB address decoder to identify the columns to be addressed. It furthermore requires a masked-bit-line "Muxor", being a circuitry selecting the column to be accessed while suppressing information of the columns, which are not to be accessed. Furthermore, a data latch may be implemented, to provide the masked data 910 stored within the memory cell to be accessed, potentially already converted to a single rail signal.

One embodiment providing the feature of internally selecting and multiplexing the columns of the memory array, will be described in more detail for the exemplary circuitry of FIG. 5. It is assumed that four masked memory sub-arrays 840a to 840d form the masked memory cell array 840 to be accessed. Therefore, identical rows within the sub-arrays are simultaneously selected by a word-line-signal 920. Further assuming that each memory sub-array 840a to 840d has four columns, four masked bit lines (or bit line pairs in full dual rail implementation) are present within the individual memory sub-arrays. As the example of FIG. 5 is highly symmetric with respect to the individual memory sub-arrays, the further explanation will focus on sub-memory-array 840a and its corresponding logic (the logic corresponding to LSB address decoder (3)).

Figure 6:
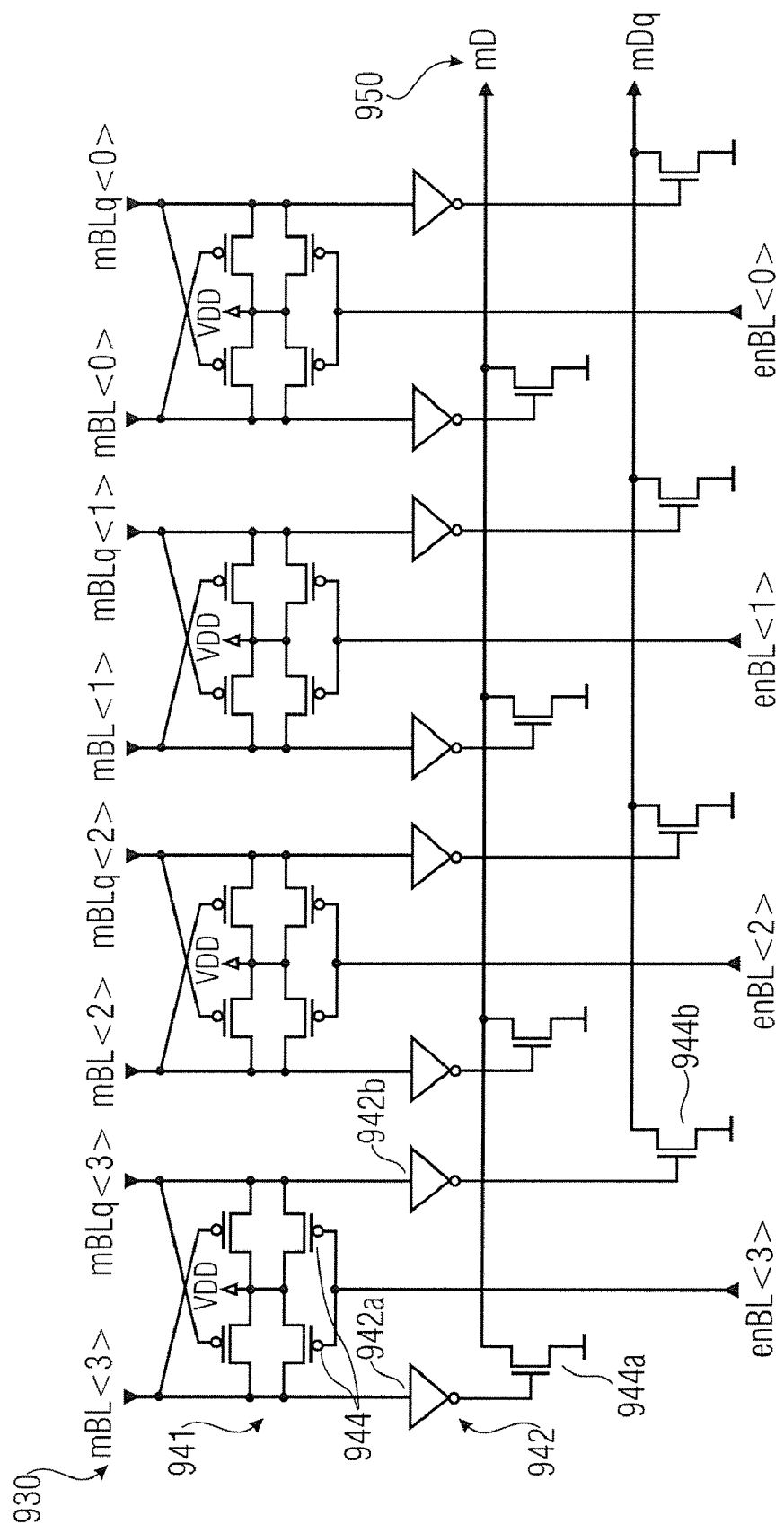
FIG. 6 shows an embodiment of a read-out scheme for accessing bit lines.

Furthermore, a full dual-rail implementation is assumed, such that four masked bit-line pairs 930 are connected to the masked bit-line Muxor 940, implementing, as detailed in FIG. 6, a wired-OR-functionality in order to allow for the multiplexing. As due to the multiplexing of the masked bit-line Muxor 940, the column to be accessed is chosen, only one pair of bit lines 950 (mD_msb) is required to connect to the data latch 960, which does, in this particular implementation, convert the dual-rail bit signal into a single-rail signal. In order to perform the multiplexing, the masked bit-line Muxor 940 requires the information of the memory column to be accessed. This information is provided by LSB address decoder 970, receiving the least significant bits of the memory address 972, a corresponding transport mask 974 and an enable signal 976 (enAD) enabling the respective processing.

Although the subsequent discussion will describe one particular embodiment with full dual-rail logic, i.e. having a complementary bit-line pair, the masked bit-line periphery subsequently described may also be used in an implementation having single-rail logic, i.e. only one bit line for each column.

Figure 5:
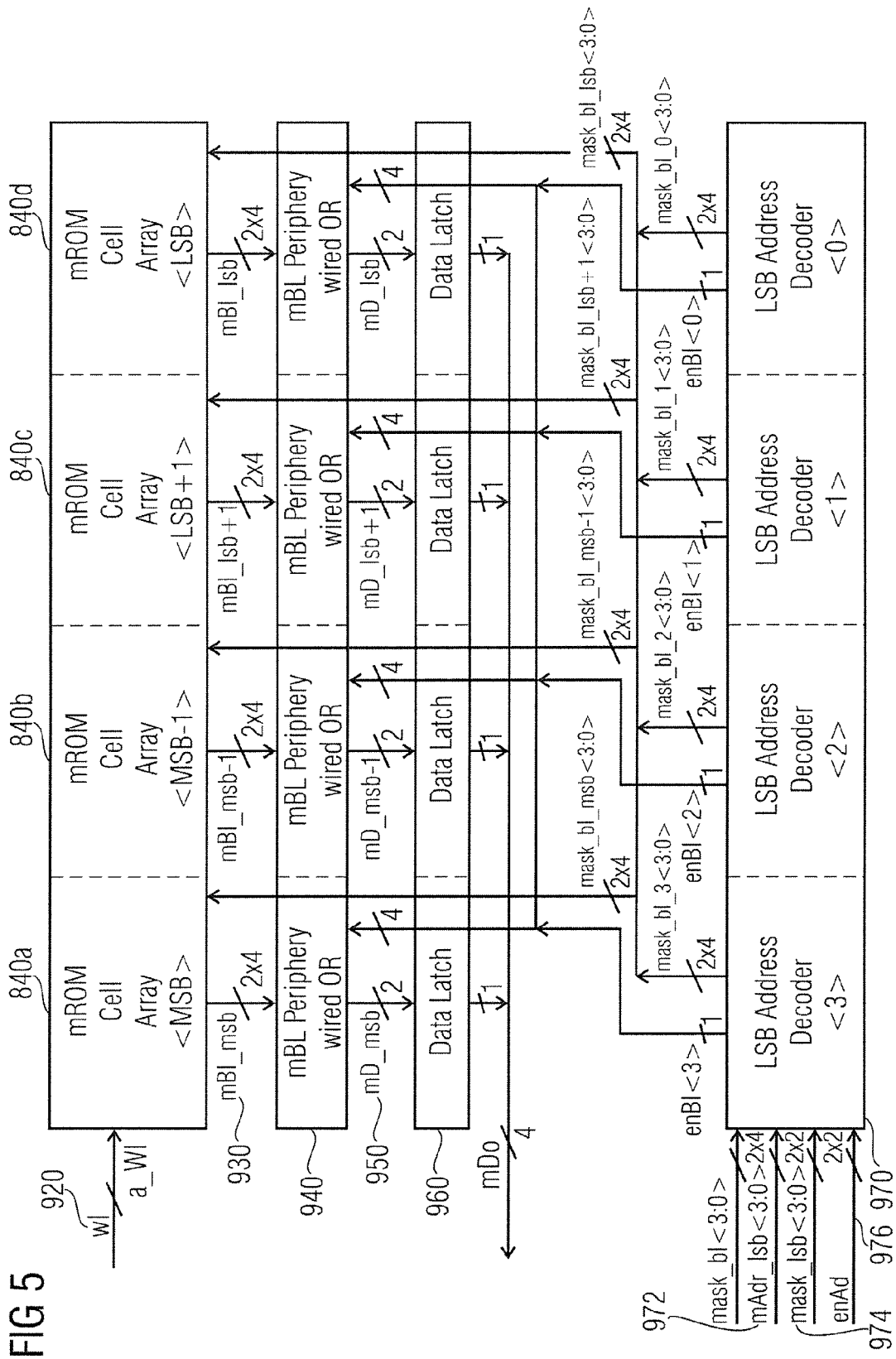
FIG. 5 shows an embodiment of access circuitry implementing multiplexing functionalities.

In FIG. 5, the masked memory cell array is assumed to be divided in four sub-memory-arrays, each being four bits wide and called mROM Cell Array<MSB>, mROM Cell Array<MSB−1>, mROM Cell Array<LSB+1> and mROM Cell Array<LSB>.

The respective four-bit-wide complementary bit lines are connected to the respective masked bit-line Muxor 940 comprising masked bit-line periphery 941 and wired OR circuitry 942. As detailed in FIG. 6, the masked bit-line periphery 941 serves to precharge the bit lines 930 prior to access a memory sub array. This is achieved by providing an enable signal enBL<j=0>, such that bit lines mBL<j> and mBLq<j> are precharged via precharge-transistors 944, which are, in this particular implementation, chosen to be p-channel-transistors. However, in alternative embodiments, the circuitry may be provided in a complementary technique, i.e. using n-channel transistors. Another type of switching devices may also be used in order to achieve the switching functionality previously and subsequently described. To this end, the use of bipolar transistors and other switching circuitry may be foreseen in alternative embodiments.

In this particular embodiment, while precharging, the bit lines are connected to the referenced potential VDD. At the end of the bit lines, the wired OR circuitry 942 comprises a plurality of inverters 942a and 942b drive pull-down transistors 944a and 944b (please note that due to the high symmetry, only one particular embodiment, i.e. one particular bit-line pair is discussed here). That is, while a bit line is low, the pull-down transistor 944a or 944b switches a precharged dual-rail data output (mD and mDq) from VDD to ground, such that their respective potentials are pulled down from a state representing a logical "1" to a state representing a logical "0".

With this respect, it may be noted that in the herein described figures, the positive supply potential VDD is associated to the logical "high state". However, in alternative embodiments, it is, of course, also possible to associate the negative supply potential VSS (in the embodiments detailed in the figures, the negative supply potential VSS is the ground potential).

Figure 7:
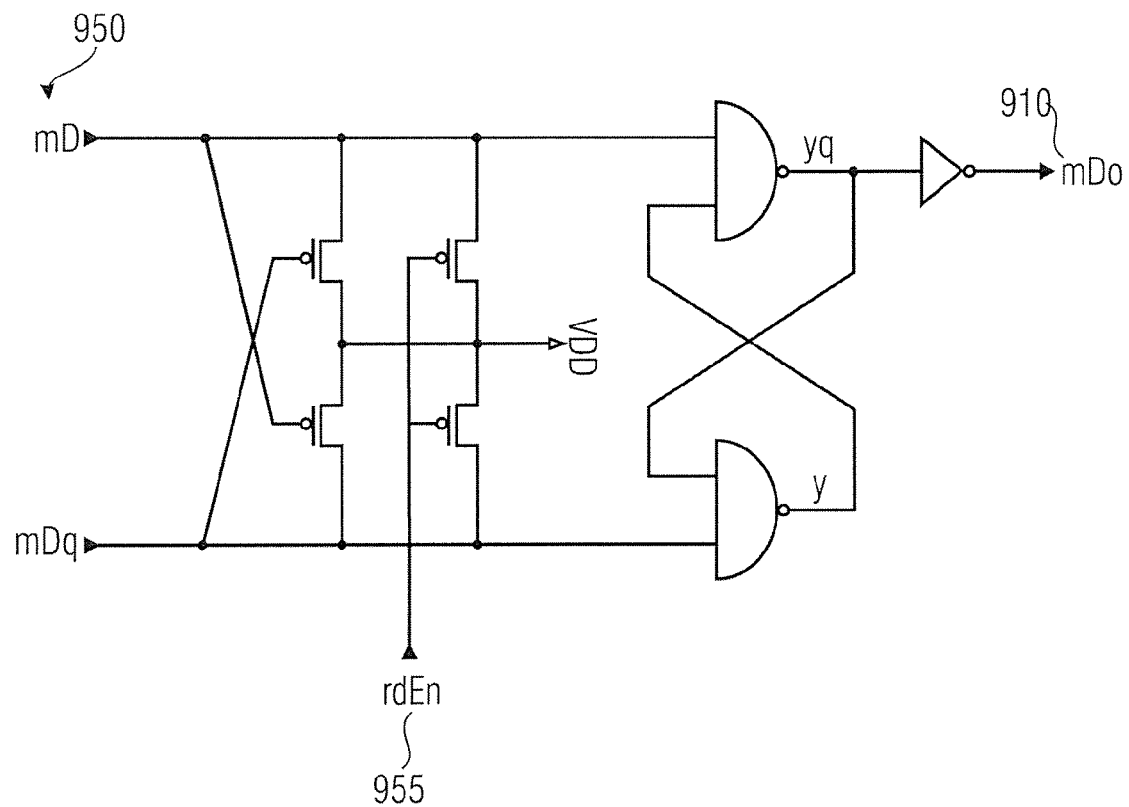
FIG. 7 shows an embodiment of a dual-rail to single-rail readout latch.

However, switching such circuitry in parallel for all bit lines implements a so-called wired-Or-Network. The wired-OR multiplexing network of FIG. 6 does, for example, provide the state (1,1) at its output, when all four bit-line pairs mBL<j>, and mBLq<j> are in their precharge state (1,1). On the contrary, if precisely one of the 8 bit lines is in a low state, the respective output (mD or mDq) is pulled down to the low state as well. That is, if it may be achieved that precisely one column provides a "valid" set of signals (i.e. one signal being low and the complementary signal line being high), the circuitry of FIG. 6 will automatically multiplex the content of this specific column to the output (mD and mDq), thus rendering the transportation of all four output bit lines to a subsequent multiplexer unnecessary. The dual-rail output 950 (mD and mDq) may be stored in a data latch structure as shown in FIG. 7, which converts the received data to a single-rail output data line 910 upon receipt of an enable signal 955.

In order to achieve the scenario of having only one bit-line pair being in a valid state (i.e. a state defined by complementary signals at either bit lines), the mask bit lines, which are for the sake of clarity not shown in FIG. 6 are brought into a state representing a valid mask only for the particular column of interest (i.e. having complementary states at either of the two mask bit lines). That is, only one of the four signal pairs (mask_bl_j<3:0>, maskq_bl_j<3:0>), j=3.0 in FIG. 5 is provided with the externally provided mask (mask_bl<3:0>, maskq_bl<3:0>).

That is:

mask_bl_j<3:0>=enBl<j>mask_bl<3:0>, maskq_bl_j<3:0>=enBl<j>maskq_bl<3:0>, j=3:0, wherein enBl<j> is the decoded column address (one-out-of-four address), which can be provided according to the following formula:

enBl<3>=enAd(mAdr_lsb<1>⊕mask_lsb<1>)·
(mAdr_lsb<0>0⊕mask_lsb<0>), enBl<2>=enAd(mAdr_lsb<1>⊕mask_lsb<1>)·(
$\overline{\text{mAdr\_lsb}<0>}$⊕mask_lsb<0>), enBl<1>=enAd(
$\overline{\text{mAdr\_lsb}<1>}$⊕mask_lsb<1>)·(mAdr_lsb<0>⊕mask_lsb<0>), enBl<0>=enAd($\overline{\text{mAdr\_lsb}<1>}$⊕mask_lsb<1>)·(
$\overline{\text{mAdr\_lsb}<0>}$⊕mask_lsb<0>), wherein enAd is an externally provided enable signal, switching the address decoder on (when enAd=1). That is, when enAd=1, precisely one of the enBl<j>=1, whereas the remaining column-specific enable signals are 0. If this is the case, only one of the four possible mask-bit-line pairs mask_bl_j<3:0>, maskq_bl_j<3:0>, becomes logically valid, i.e. is set to complementary logical states. The remaining mask bit lines have an unaltered state, i.e. they remain in their respective precharge condition, that is in (0,0).

Consequently, the respective masking transistors (see, for example, transistors 180 and 190 of FIG. 1) remain in their non-conductive off-state, such that the respective bit-line pairs do also remain in their precharge condition. In other words, when only one mask bit-line pair is provided with a valid masking condition, only the respective bit-line pair will have a logically valid condition, being characterized by one bit line not being in its precharged state. This condition is transferred to the data output 950 of the bit-line Muxor 950 of FIG. 6. Thus, the required multiplexing of the data is performed with only few circuitry elements, utilizing only one single bit-line pair. Generally, the following masking conditions (mapping of the externally provided mask_bl to the internal mask_bl_msb) applies (see FIG. 5):

mask_bl_msb<3>=mask_bl__3<3>, mask_bl_msb<2>=mask_bl__2<3>, mask_bl_msb<1>=mask_bl__1<3>, mask_bl_msb<0>=mask_bl__0<3>, mask_bl_msb−1<3>=mask_bl__3<2>, mask_bl_msb−1<2>=mask_bl__2<2>, mask_bl_msb−1<1>=mask_bl__1<2>, mask_bl_msb−1<0>=mask_bl__0<2>, mask_bl_lsb+1<3>=mask_bl__3<1>, mask_bl_lsb+1<2>=mask_bl__2<1>, mask_bl_lsb+1<1>=mask_bl__1<1>, mask_bl_lsb+1<0>=mask_bl__0<1>, mask_bl_lsb<3>=mask_bl__3<0>, mask_bl_lsb<2>=mask_bl__2<0>, mask_bl_lsb<1>=mask_bl__1<0>, mask_bl_lsb<0>=mask_bl__0<0>, One particular example shall illustrate the possibility to only select one particular bit-line output by providing only mask signals for the respective column.

It is assumed, that the decoding of the LSB-address (and thus column to be accessed) results in:

enBL<3:0>=(0,0,1,0), and the respective bit-line masks also provided to the mask bit-line periphery circuitry 900 may be defined as follows:

mask_bl<3:0>=(m3,m2,m1,m0), maskq_bl<3:0>=(m3q,m2q,m1q,m0q), with mjq=not(mj).

Thus, only the respective mask bit lines of single sub-arrays are provided with the externally provided mask:

mask_bl_msb<3>=0, mask_bl_msb<2>=0, mask_bl_msb<1>=mask_bl__1<3>=m3, mask_bl_msb<0>=0 mask_bl_msb−1<3>=0, mask_bl_msb−1<2>=0, mask_bl_msb−1<1>=mask_bl__1<2>=m2, mask_bl_msb−1<0>=0, mask_bl_lsb+1<3>=0, mask_bl_lsb+1<2>=0, mask_bl_lsb+1<1>=mask_bl__1<1>=m1, mask_bl_lsb+1<0>=0, mask_bl_lsb<3>=0, mask_bl_lsb<2>=0, mask_bl_lsb<1>=mask_bl__1<0>=m0, mask_bl_lsb<0>=0, and maskq_bl_msb<3>=0, maskq_bl_msb<2>=0, maskq_bl_msb<1>=0, maskq_bl__1<3>=m3q, maskq_bl_msb<0>=0, maskq_bl_msb−1<3>=0, maskq_bl_msb−1<2>=0, maskq_bl_msb−1<1>=maskq_bl__1<2>=m2q, maskq_bl_msb−1<0>=0, maskq_bl_lsb+1<3>=0, maskq_bl_lsb+1<2>=0, maskq_bl_lsb+1<1>=maskq_bl__1<1>=m1q, maskq_bl_lsb+1<0>=0, maskq_bl_lsb<3>=0, maskq_bl_lsb<2>=0, maskq_bl_lsb<1>=maskq_bl__1<0>=m0q, maskqk_bl_lsb<0>=0, Summarizing in short, in each of the four-bit-wide memory sub-arrays 940a to 940d, the bit-line-pair corresponding to the memory cell to be accessed is selected via the mask-signal bit lines. Such, only the corresponding bit line (bl<1>, blq<1>) in the particular example previously described, carries a logically valid state, which is defined by the particular memory cell to be accessed.

This may lead to a significant reduction in required circuitry elements and/or signal lines in particular memory implementations. Furthermore, signal run times and/or the overall power consumption may be reduced, since only the particular bit- and mask-bit lines need to be charged, which carry or the addressed information. As for to the above example with four columns, the precharge and recharge of three bit lines may be saved.

Figure 8:
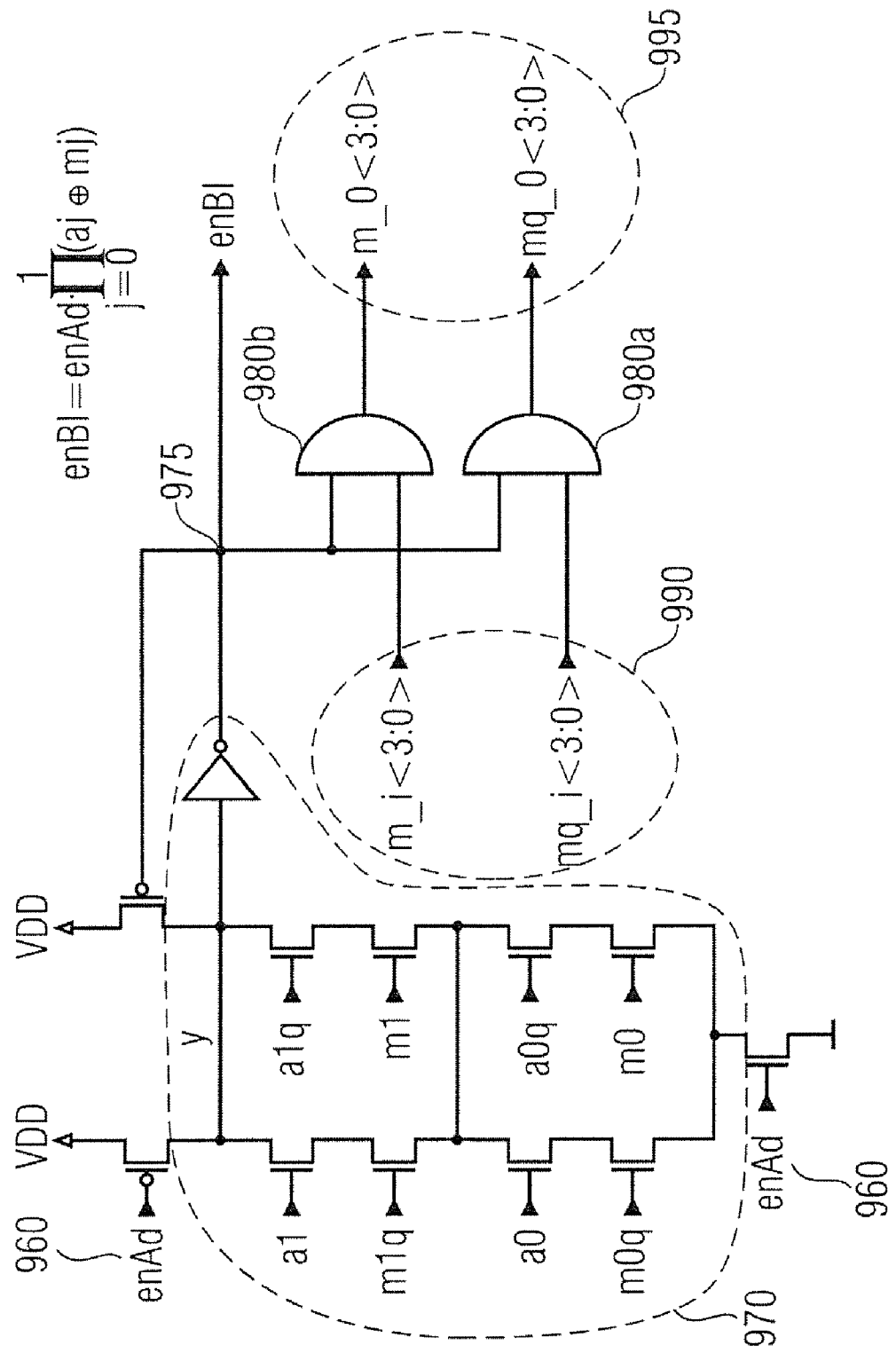
FIG. 8 shows an embodiment of a masked address decoder.

One particular example of a LSB-decoder for selecting the respective column, that is for providing a valid mask signal (being composed of two complementary logical states) to the particular column of interest, is shown in FIG. 8.

Upon receipt of a global enable signal enAd 960, which enables a decision circuit 970 to provide an enable signal at its output 975 indicating whether the mask signal bit lines associated to the address decoder correspond to the column to be addressed, the enable signal is generated. To this end, the mask-address decoder receives the masked address (a0 and a1) together with the corresponding address mask (m0 and m1), such as to decide whether the column in question, i.e. the column to which the mask-address decoder is associated, is the column to be accessed. To this end, the decision circuit 970 performs the following calculation:

$$enBl = enAd \prod_{j=0}^{1} (aj \oplus mj)$$

As a result, the decision circuit 970 generates an enable signal 975 (enBL), which is logically high, when the column to which the mask-address decoder is associated corresponds to the column to be accessed. In that particular case only, the two AND-gates 980a and 980b forward the mask signal (array mask signals m_i<3:0> and mq_i<3:0>) to the respective mask-signal output 995 of the mask address decoder. Thus, only the mask bit lines, which correspond to the column to be accessed are brought into a logically valid state.

In short, the access scenario described in the above figures may be characterized as a method for operating a plurality of masked memory cells organized in at least two groups, each group using a individual mask signal, which comprises providing a logically valid mask signal for a selected group comprising a memory cell to be accessed providing a logically invalid mask signal for all groups other than the selected group.

The method further comprises providing a signal comprising two logically complementary sub-signals as the logically valid mask signal and providing a signal comprising two logically identical sub-signals as a logically invalid mask signal.

The method may further comprise providing a precharge signal which is indicative of a precharge of bit lines associated to the selected group and indicative of the non-necessity of a precharge of bit lines associated to all groups other than the selected group.

The method may further comprise applying the logically valid mask signal to a masking bit line pair associated to the selected group and applying the logically invalid mask signal to further masking bit line pairs associated to all groups other than the selected group.

The method may further comprise precharging only the bit lines associated to the selected group.

The hardware previously described may be characterized as a masked address decoder associated to masking signal bit lines of a column of masked memory cells of a memory cell array adapted to provide a mask signal for the masking signal bit lines, which comprises an input interface adapted to receive an array mask signal for the memory cell array and a column-address signal indicative of a column of the array to be accessed; a decision circuit adapted to generate using the column-address signal, an enable signal, the enable signal indicating whether the masking signal bit lines correspond to the column to be accessed; and a mask signal interface adapted to use the array mask signal as a mask signal at the presence of an enable signal indicating the correspondence of the masking signal bit lines and the column to be accessed.

The masked address decoder may furthermore comprise an input interface is adapted to receive an array mask signal comprising two sub signals, each of one of two possible logical states.

The masked address decoder may furthermore comprise a decision circuit which is further adapted to generate, further using the array mask signal, an enable signal indicating the correspondence of the masking signal bit lines and the column to be accessed only when the array mask signal comprises two logically complementary sub signals.

The masked address decoder may furthermore comprise a decision circuit operative to generate an enable signal of a logical "high" state, when the masking signal bit lines correspond to the column to be accessed; and a masking signal generator is adapted to generate the mask signal performing a logical "AND" operation using the enable signal and the array mask signal as inputs.

The masked address decoder may furthermore comprise an output interface adapted to apply the mask signal to the masking signal bit lines.

Figure 9:
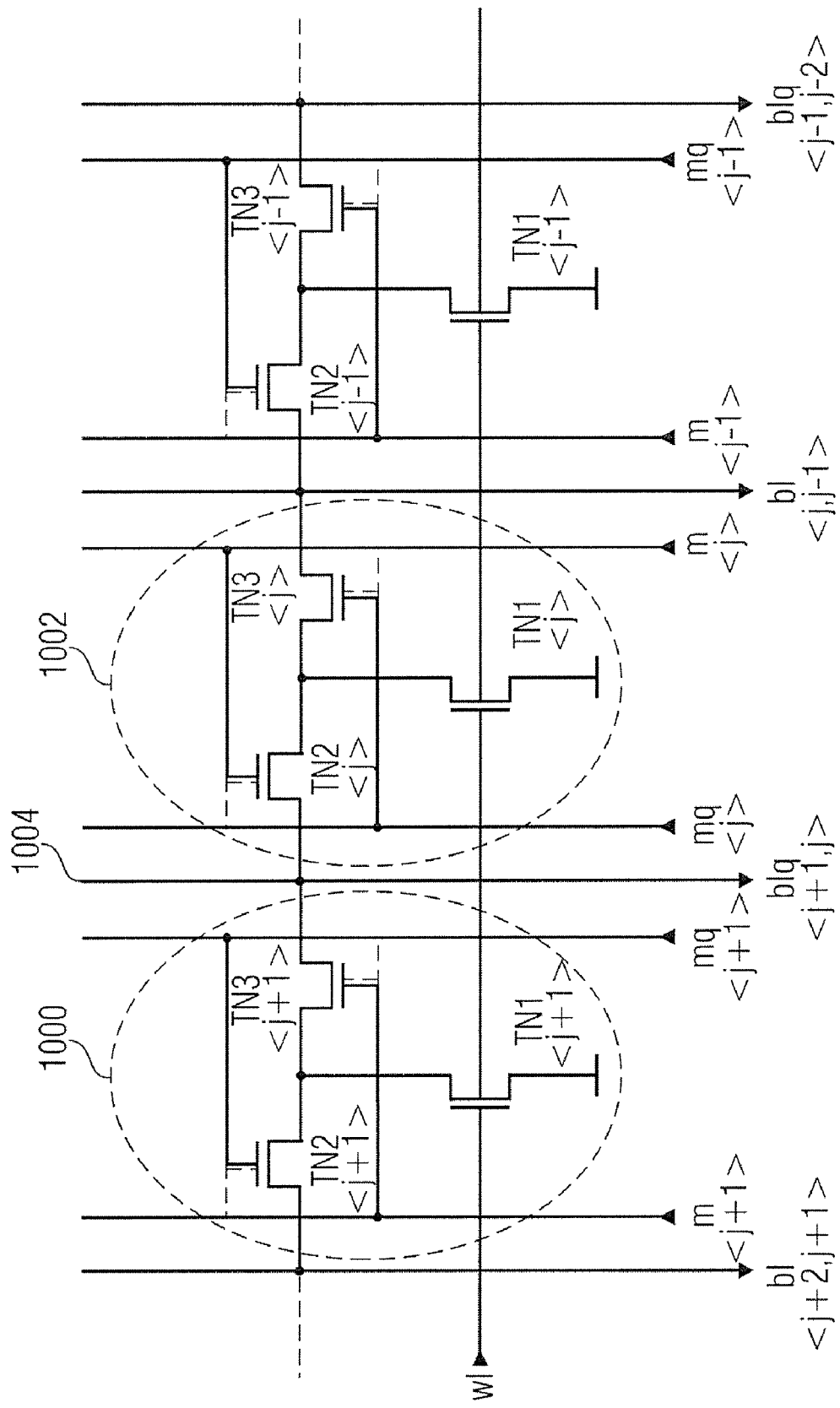
FIG. 9 shows an embodiment of an alternative cell-array configuration.

When being able to selectively use the mask bit lines of a memory cell array of the masked memory cells, by, for example, implementing the previous access logic, one may furthermore save semiconductor area using memory cells organized or laid out in accordance with the embodiment of FIG. 9. To this end, an array of masked memory cells may be provided, in which memory cells of neighboring columns share the same bit lines. That is, neighboring memory cells 1000 and 1002 may utilize the same bit line 1004 to which the respective outputs of memory cells of different columns (groups) are connected. If all mask bit lines m(j) and mq(j) are in the precharge states, i.e. in their (0,0) states, except of the mask bit lines of column to be accessed, only the masked memory cell of the respective column will be able to pull down the precharged bit lines (from their (1) state to the (0) state). That is, only the selected column (i.e. the memory cell as selected by word line signal wl) changes the logical state or potential of the bit lines connected to the respective memory cell. Therefore, neighboring memory cells may share bit lines without negatively influencing one another.

Utilizing a memory arrangement as described in FIG. 9, the area consumed by the respective memory array may be reduced by as much as 30%.

However, the area and number of circuitry elements required by masked memories may be further reduced, irrespective of the capability of selectively using the masked bit lines.

Figure 10:
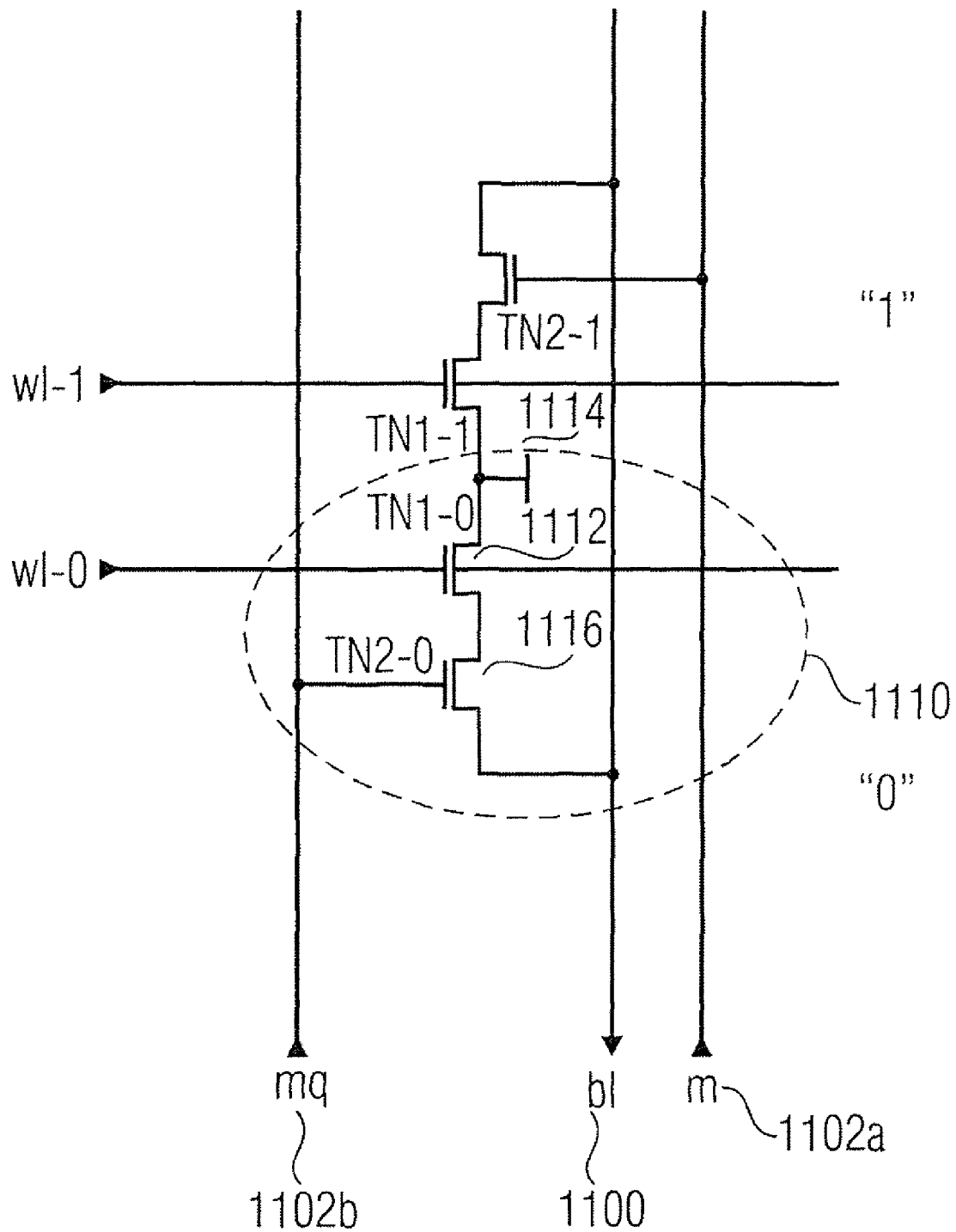
FIG. 10 shows an embodiment of an efficient masked memory cell implementation.

For example, FIG. 10 shows an embodiment in which a masked ROM-cell may be formed using only two transistors. This reduction in size and circuitry becomes partly feasible by using a single bit line 1100 together with two complementary mask bit lines 1102a and 1102b. The memory cells (as an example, only memory cell 1110 will be described) are selected by respective word lines connected to the gate terminal of a word-line transistor 1112 of the memory cell 1110. A first channel terminal of the word-line transistor 1112 is coupled to reference potential 1114 (in this particular example ground potential), whereas the second channel terminal is coupled to a first channel terminal of a masking transistor 1116, whose second channel terminal is connected to the bit line 1100. The gate terminal of the masking transistor 1116 is either connected to the first mask bit line 1102a or, as in the examined memory cell 1110, to the second mask bit line 1102b, thus defining the content stored within the read-only memory cell. Prior to an access to the memory cell, the bit line is precharged to its precharge state (bl=1). For access, the word line (wl–0) is activated (i.e. high, wl=1) and the respective mask bit lines are in complementary states, i.e. (m, mq)=(0,1) or (1,0). That is, logically valid mask states are applied to the mask bit lines. As previously mentioned, it is assumed that the logical "1"-state corresponds to the potential VDD and the "0"-state corresponds to the potential VSS.

One may define a convention, determining which state is to be assumed as logically high, for example according to the following table:

bl=0 with (m,mq)=(0,1) for a cell programmed to "0";

bl=1 with (m,mq)=(1,0) for a cell programmed to "0";

bl=1 with (m,mq)=(0,1) for a cell programmed to "1";

bl=0 with (m,mq)=(1,0) for a cell programmed to "1".

Thus, the memory cell 1110 having a reduced number of circuit elements, represents a logical "0", whereas the other illustrated memory cell having a gate terminal of the masking transistor coupled to mask bit line 1102a represents a logical "1". Using the masked memory cell of FIG. 10, a significant decrease in required semiconductor area may be achieved.

Figure 11:
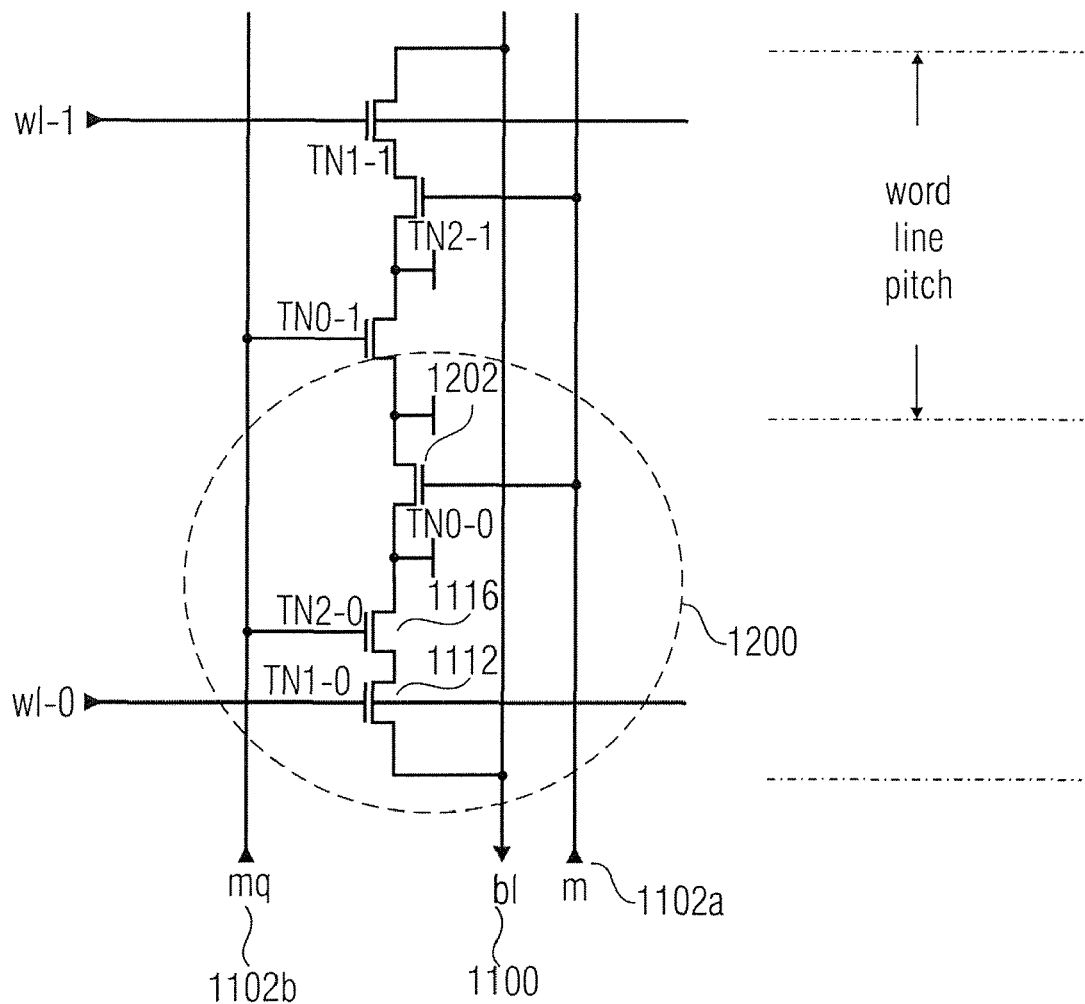
FIG. 11 shows an alternative embodiment of a masked memory cell implementation.

FIG. 11 shows a further embodiment, which is based on the memory cell of FIG. 10. The memory cell 1200 comprises the same elements as the memory cell of FIG. 10. Therefore, those shared elements are given the same reference numerals and only additional elements are explained in more detail. In particular, the memory cell 1200 differs from the memory cell 1110 in an additional balancing transistor 1202, which is, with both channel terminals, coupled to a reference potential (in this example the ground potential). However, the gate terminal of the balancing transistor 1202 is coupled to the mask bit line, which is not coupled by the terminal of the mask transistor 1116. That is, in the example of FIG. 11, the gate terminal of the balancing transistor 1202 is connected to the mask bit line 1102a. This embodiment may reduce a capacitive symmetry of the individual mask bit lines 1102a and 1102b. That is, even when the number of stored values "0" and "1" along a column differed strongly, a capacitive load of both mask bit lines will still be identical. This may not necessarily be the case in the example of FIG. 10. Therefore, a risk of a DPA/EMA attack targeting a potential unequal capacitance of signal lines and the corresponding differing current flow in recharging those bit lines, may be reduced.

Figure 12:
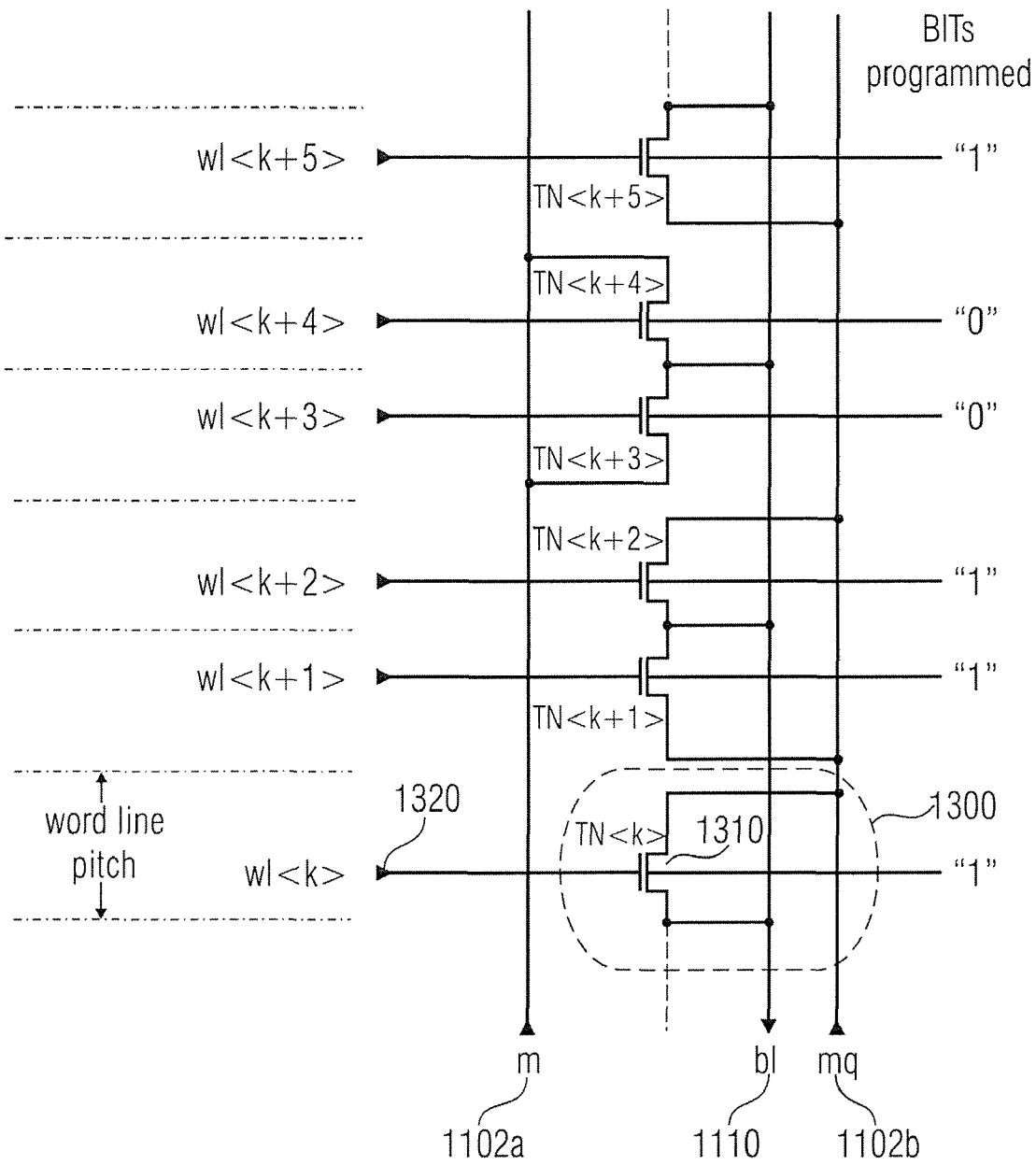
FIG. 12 shows a further alternative implementation of a masked memory cell.

FIG. 12 shows a further embodiment of a masked memory cell, utilizing one single transistor to store the masked information. The maskable read-only memory cell 1300 comprises a transistor 1310 having a gate terminal coupled to a word line 1320. A first channel terminal is coupled to the bit line 1110, whereas the second channel terminal may be coupled to either the first mask bit line 1102a or to the second mask bit line 1102b, depending on the logical information stored within the ROM-cell. The particular memory cell 1300 represents a logical "1", given the previously introduced convention.

However, memory cell 1300 differs from the previously discussed memory cells in that a precharge state of the mask bit lines 1102a and 1102b prior to an access to the memory cell is to be (1,1). The precharge state of the bit line is, however, still (1). Thus, masked logical values can be stored utilizing only one single transistor, still implementing the high security feature of masked signal transport.

Figure 1:
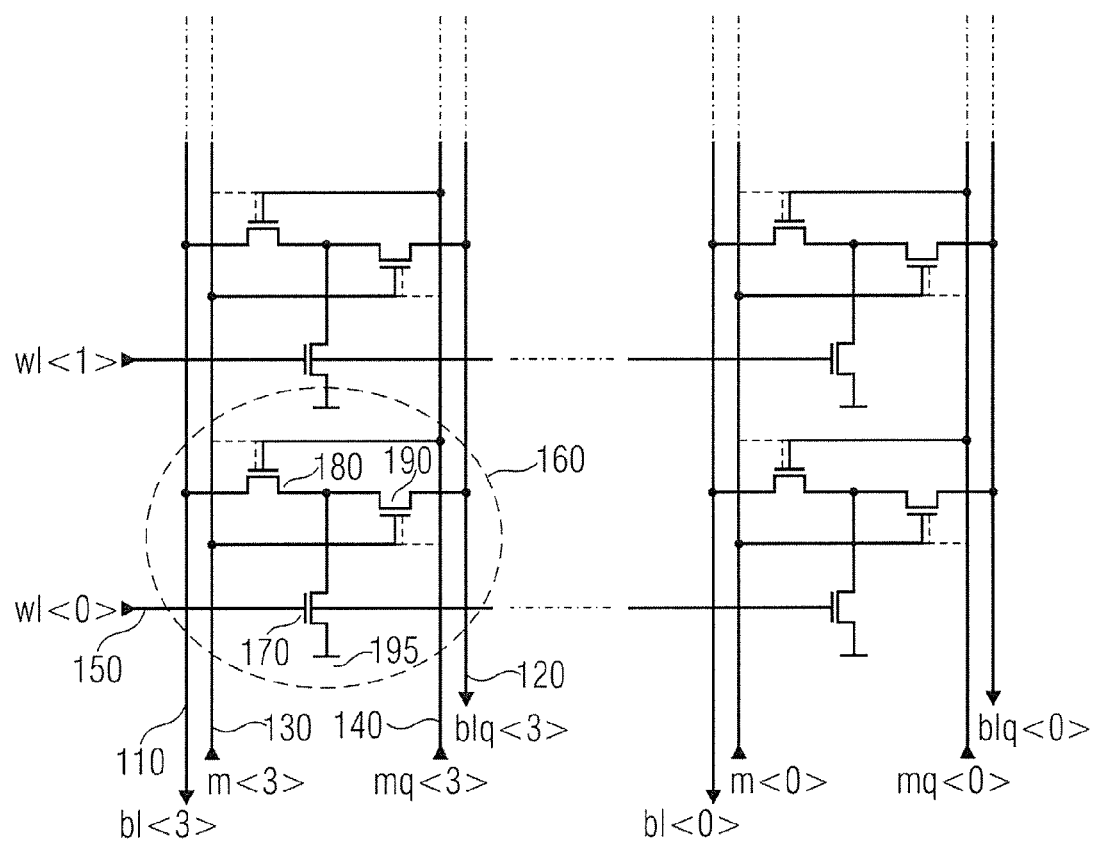
FIG. 1 shows a masked-ROM-cell.
Figure 2:
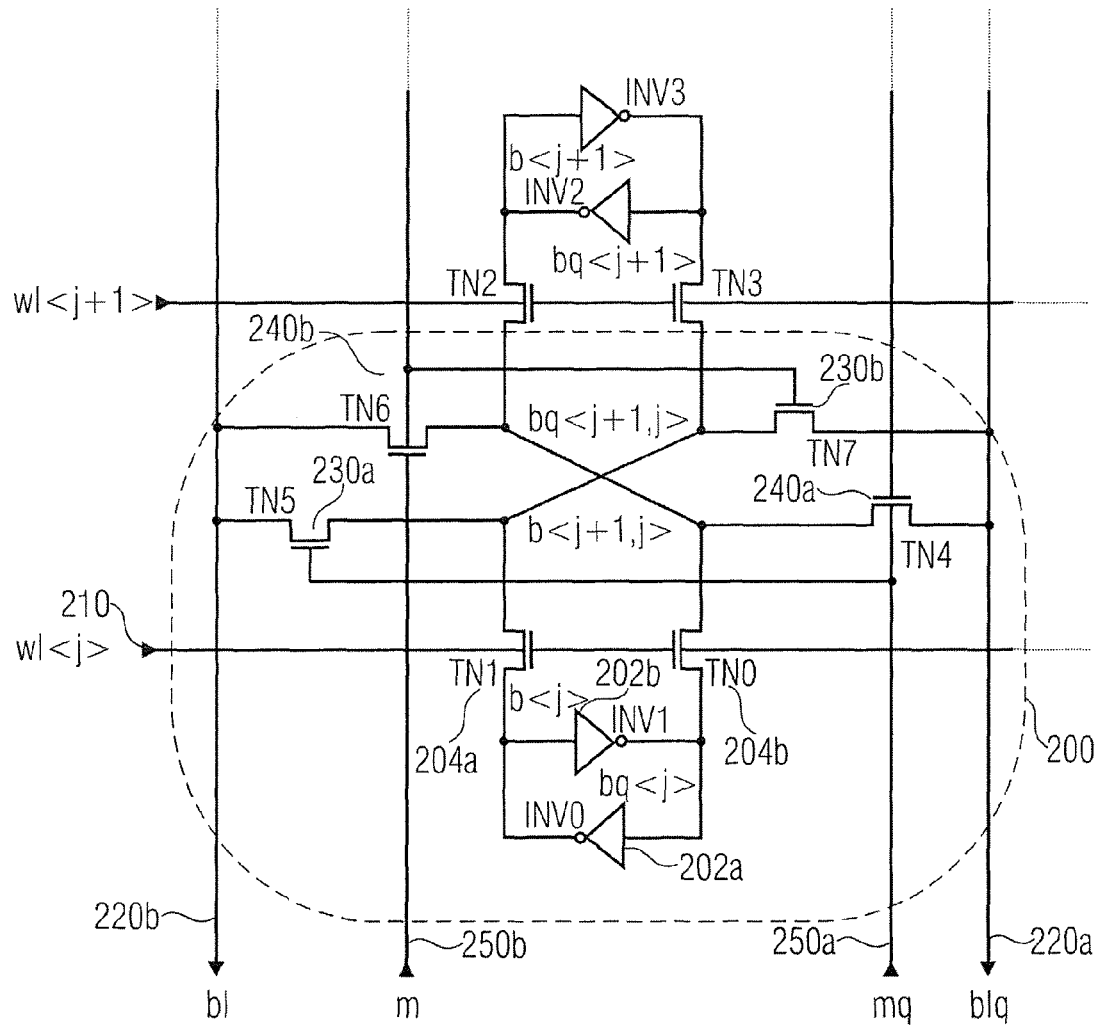
FIG. 2 shows a masked-RAM-cell.

Using the embodiment of FIG. 12, the semiconductor area required by a memory array may be reduced by up to 75% as compared to the memory cell of FIG. 1.

This normally does not only mean a reduction in semiconductor area but may also lead to a decrease in signal run-times and energy consumption of the cells. It may be emphasized that in order to provide an even more efficient implementation, the embodiments implementing the integrated multiplexing (according to, for example, FIGS. 4 to 8) may be combined with all further embodiments of memory cells described herein. In the particular case of the memory cell of FIG. 12, the then required modification in that the precharge states of the mask bit lines need to be (1,1) are obvious.

Figure 13:
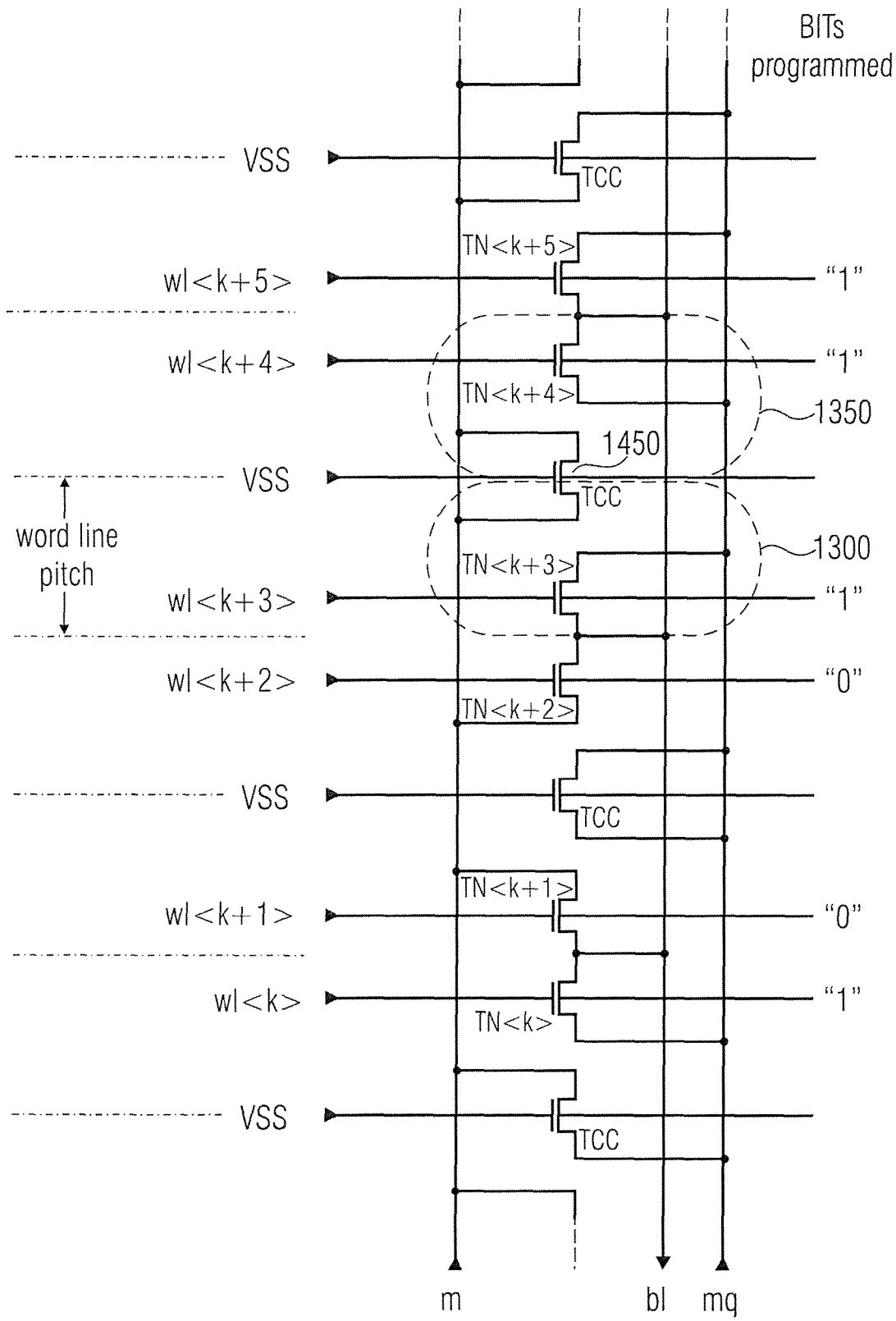
FIG. 13 shows a further memory array alternative implementing the memory cells of FIG. 12.

FIG. 13 provides a further implementation of a memory array utilizing the memory cells illustrated in FIG. 12. In order to provide equal capacitance on both mask bit lines 1102a and 1120b, balancing transistors 1450 are introduced for any two memory cells as, for example, memory cell 1300 and 1350. The gate terminal of the balancing transistor 1450 is coupled to a reference potential, which remains unchanged, such that the balancing transistor 1450 is not switched during normal operation. Further, the channel terminals of the balancing transistors are coupled to either the first mask bit line 1102a or the second mask bit line 1102b, such that a total number of channel terminals of the two memory cells 1300 and 1350 and the associated balancing transistor 1450 coupled to either mask bit line is equal. Thus, it may be achieved that no capacitive asymmetry occurs, even when the number of logically stored values "0" and "1" are unequally distributed within the individual columns of the memory array.

Embodiments implementing the memory cells illustrated in FIG. 13 may reduce the required area as much as up to 55% compared to the memory cell of FIG. 1.

It may be noted, that, using the previous convention, a logically "0" programmed masked memory cell of the embodiments of FIGS. 10 to 13 may, alternatively be characterized by the following associations:

bl<–m whereas a logically "1" programmed memory cell may be characterized by:

bl<–mq.

In short, the maskable memory cells of FIGS. 10 to 13 may be characterized in that they comprise a single bit-line output, a first and a second input for a binary mask signal, wherein the maskable memory cell is capable of being accessed, so as to output, depending on the binary mask signal, a first binary value or a second binary value at its bit-line output.

These maskable memory cells are configured to accept a pair of complementary logical signals as a valid mask signal.

Although the embodiments previously discussed are implemented using particular FETs and corresponding voltage levels together with a particular convention, as to what state is to be interpreted as a logical "1" and "0", further embodiments are, of course, not restricted to those presumptions. In particular, the mapping between the physical states and the corresponding logical states may be chosen differently.

Furthermore, the technology implementing the embodiments and the switching elements previously discussed are not restricted to one particular implementation. Instead, further active switching elements may be used, such as, for example, n-channel or p-channel FETs, bipolar transistors or other switching elements. The logical elements previously described are not restricted to a specific implementation. Instead, an inverter, OR- or XOR- or AND-gates, or XOR-functionalities may be implemented in differing technologies and circuitry, yielding the same results.

Furthermore, particular examples or techniques previously discussed may be combined in order to increase the efficiency of the implementation.

Depending on certain implementation requirements, further embodiments can be implemented in hardware or in software. The implementation can be performed using a digital storage medium, in particular a disk, DVD or a CD having electronically readable control signals stored thereon, which cooperate with a programmable computer system such that embodiments of the methods are performed. Generally, some embodiments can, therefore, be a computer program product with a program code stored on a machine readable carrier, the program code being operative for performing the embodiments when the computer program product runs on a computer. In other words, some embodiments are, therefore, a computer program having a program code for performing at least one of the methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

The invention claimed is:

1. An array of masked memory cells comprising:
a first memory cell in a first column and a second memory cell in a second different column,
wherein the first memory cell is capable of being accessed, so as to output, dependent on a first binary mask signal, a first binary value at a first output and a second binary value at a second output or vice versa,
wherein the second memory cell is capable of being accessed, so as to output, dependent on a second binary mask signal, a first binary value at a third output and a second binary value at a fourth output or vice versa, and
wherein the second and the third outputs of the memory cells are connected to an identical bit line of the memory array.

2. The array of masked memory cells in accordance with claim 1, further comprising a word line adapted to enable access to multiple memory cells, each of the multiple memory cells associated with a different column of the array.

3. The array of masked memory cells in accordance with claim 1, further comprising a pair of mask signal bit lines for each column, adapted to provide the binary mask signal to each masked memory cell within one column.

4. The array of masked memory cells in accordance with claim 1, wherein the masked memory cells are ROM cells.

5. The array of masked memory cells in accordance with claim 1, wherein the masked memory cells are RAM cells.

6. A masked read-only memory cell for use in a masked memory array, comprising:
a word line transistor having a gate terminal coupled to a word line of the memory array, a first channel terminal coupled to a reference potential and a second channel terminal coupled to a third channel terminal of a masking transistor,
wherein the masking transistor comprises a fourth channel terminal coupled to a bit line of the memory array, and
wherein the gate terminal of the masking transistor is coupled to either a first mask bit line or to a second mask bit line of a mask bit line pair of the memory cell, depending on the logical state stored in the memory cell.

7. The masked read-only memory cell in accordance with claim 6, further comprising a balancing transistor adapted to be coupled to the reference potential with a fifth and a sixth channel terminal, wherein the gate terminal of the balancing transistor is adapted to be coupled to the mask bit line which is not coupled to the gate terminal of the masking transistor.

8. The read-only masked memory cell in accordance with claim 6, wherein the memory cell is configured to accept a pair of complementary logical states as a valid masking signal.

9. A masked read-only memory cell for use in a masked memory array, comprising:
a transistor having a gate terminal coupled to a word line of the memory array, a first channel terminal coupled to a bit line of the memory array, and a second channel terminal coupled to either a first mask bit line or to a second mask bit line of a mask bit line pair associated to the memory cell, depending on the logical state stored within the memory cell.

10. A masked read-only memory array, comprising at least two read-only memory cells according to claim 9, organized in a row utilizing the same bit line and the same mask bit line pair, further comprising:
a balancing transistor comprising a gate terminal coupled to a reference potential and first and second channel terminals coupled to the first and/or second mask bit lines, such that the total number of channel terminals of the two read-only memory cells and the balancing transistor coupled to either mask bit line is equal.

11. The read-only masked memory cell in accordance with claim 9, wherein the memory cell is configured to accept a pair of complementary logical states as a valid masking signal.

12. The masked read-only memory cell according to claim 9, wherein the bit line is a single-rail bit line.

13. A masked read-only memory array, comprising at least two read-only memory cells according to claim 9, with each memory cell merely consisting of exactly one transistor.

14. A masked read-only memory array, comprising at least two read-only memory cells according to claim 9, wherein the first and second mask bit lines and the bit line to which the first and second channel terminals of the transistors of which are connected, respectively, are common for the least two read-only memory cells.

15. The masked read-only memory cell according to claim 9, wherein the first channel terminal is directly connected to the bit line of the memory array.

16. The masked read-only memory cell according to claim 9, wherein the second channel terminal is directly connected to either the first mask bit line or to the second mask bit line of the masked bit line pair.

17. The masked read-only memory cell according to claim 9, wherein the first and second channel terminals are drain and source terminals of the transistor, respectively.

* * * * *